(12) United States Patent
Püschner et al.

(10) Patent No.: US 6,469,902 B1
(45) Date of Patent: Oct. 22, 2002

(54) ADHESIVE JOINT ASSEMBLY

(75) Inventors: Frank Püschner, Kelheim; Erik Heinemann, Regensburg; Ralf Henn, Hardert, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/440,409

(22) Filed: Nov. 15, 1999

Related U.S. Application Data

(63) Continuation of application No. PCT/DE98/01176, filed on Apr. 28, 1998.

(51) Int. Cl.[7] ................................................. H05K 1/14
(52) U.S. Cl. ...................................... 361/737; 361/783
(58) Field of Search ................................. 361/737, 783, 361/771; 257/668; 428/901; 174/255, 259

(56) References Cited

U.S. PATENT DOCUMENTS

| | | | | |
|---|---|---|---|---|
| 4,955,171 A | * | 9/1990 | Kassatz et al. ................ 52/612 |
| 5,726,491 A | * | 3/1998 | Tajima et al. ................ 257/668 |
| 5,917,705 A | * | 6/1999 | Kirschbauer et al. ....... 361/737 |
| 6,049,121 A | * | 4/2000 | Toyosawa et al. .......... 257/668 |
| 6,168,851 B1 | * | 1/2001 | Kubota ........................ 428/200 |
| 6,251,502 B1 | * | 6/2001 | Yasue et al. ................ 428/209 |

FOREIGN PATENT DOCUMENTS

| | | |
|---|---|---|
| DE | 4441931 C1 | 7/1995 |
| EP | 0527438 A2 | 2/1993 |
| WO | WO 97/19463 | 5/1997 |

\* cited by examiner

*Primary Examiner*—David Martin
*Assistant Examiner*—Thanh S. Phan
(74) *Attorney, Agent, or Firm*—Laurence A. Greenberg; Werner H. Stemer; Ralph E. Locher

(57) ABSTRACT

The invention relates to an adhesive joint which connects a body made of a first material to a plastic body. The adhesive joint is formed by an adhesive laminate which includes a flexible core layer made of acrylate and outer layers made of hot-melt adhesive which respectively adjoin the first body and the plastic body, and a transition layer is respectively arranged between the outer layers and the core layer.

6 Claims, 2 Drawing Sheets

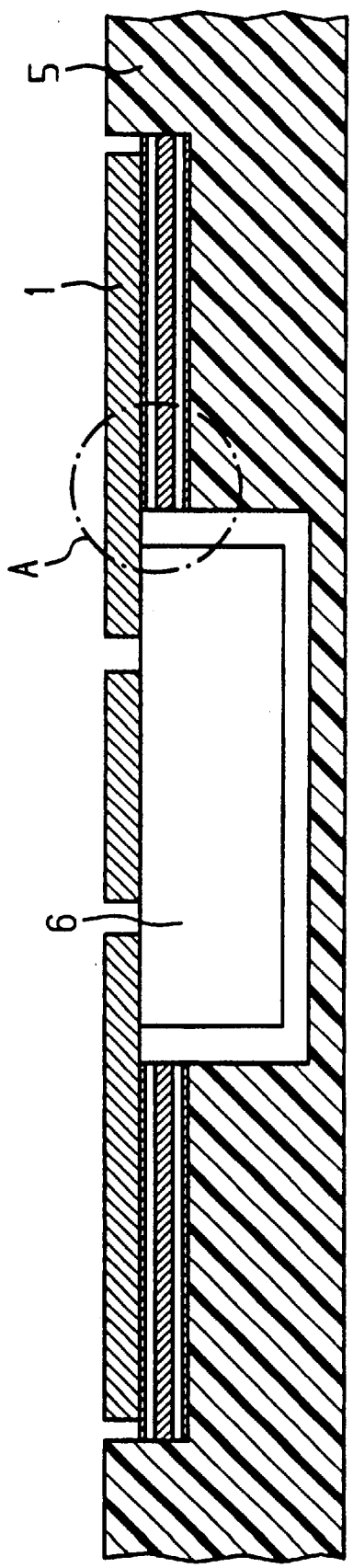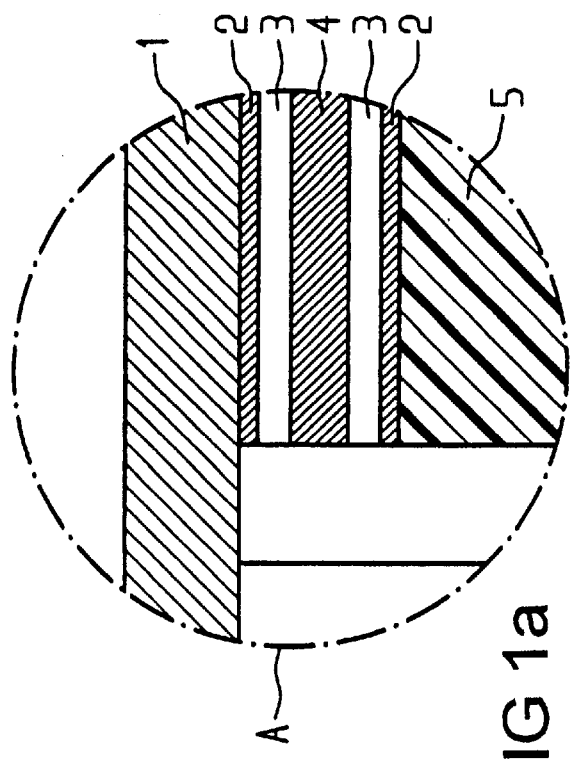

ADHESIVE JOINT ASSEMBLY

CROSS REFERENCE TO THE RELATED APPLICATION

This is a continuation of copending International Application PCT/DE98/01176, filed Apr. 28, 1998, which designated the United States.

BACKGROUND OF THE INVENTION

Field of the Invention

The invention relates to an adhesive joint which connects a body made of a first material to a plastic body by means of an adhesive layer. The adhesive layer has a multi-layered structure which is composed of a flexible core layer made of acrylate and outer layers made of hot-melt adhesive which respectively adjoin the first body and the plastic body. The invention further relates to a card configuration using such an adhesive joint.

U.S. Pat. No. 5,917,705 (cf. German patent DE 44 41 931 C1) discloses an adhesive joint by which a semiconductor module is connected to a chip card or smart card element. The semiconductor module comprises a carrying element, a so-called lead frame, to which a semiconductor chip is attached. Contacts on the semiconductor chip are attached to the lead frame by means of bonding. The lead frame is connected to the card element by an adhesive joint. The adhesive joint comprises a multi-layered adhesive which has a flexible middle layer bonded to the two adherend elements, which comprise on the one hand the lead frame and on the other hand the card element, via an outer layer. These outer layers advantageously comprise in turn a hot-melt adhesive. A disadvantage of that configuration is that it does not exhibit adequate durability to, say, bending stress in a smart card, even though the adhesive joint is flexible.

SUMMARY OF THE INVENTION

It is accordingly an object of the invention to provide an adhesive joint and a smart card configuration, comprising a semiconductor module and a card element which are joined together by an adhesive joint, which overcomes the above-mentioned disadvantages of the heretofore-known devices and methods of this general type and which exhibits improved durability.

With the foregoing and other objects in view there is provided, in accordance with the invention, an adhesive joint assembly connecting a body made of a first material to a plastic body, comprising:

a multi-layer adhesive laminate layer disposed between and adhesively joining a first body of a first material and a plastic body;

the laminate layer being formed of a flexible core layer made of acrylate, outer layers made of hot-melt adhesive respectively adjoining the first body and the plastic body, and a transitional layer respectively disposed between the outer layers and the core layer.

In this way, a durable and intimate bond between the hot-melt adhesive and the middle layer is ensured.

In accordance with an added feature of the invention, the transitional layer is a PET film. In the alternative, the transitional layer is a polycarbonate film.

With the above and other objects in view there is provided, in accordance with the invention, a smart card configuration, comprising:

a card element made of plastic;

a carrying element and a semiconductor chip supported on the carrying element; and an adhesive joint assembly as described above disposed between and adhesively joining the carrying element to the card element.

In accordance with an additional feature of the invention, the carrying element is electrically conductive.

In accordance with a further feature of the invention, the carrying element is composed of epoxy-resin glass-fiber-reinforced fabric.

In accordance with a concomitant feature of the invention, the carrying element is composed of a ceramic material.

Other features which are considered as characteristic for the invention are set forth in the appended claims.

Although the invention is illustrated and described herein as embodied in an adhesive joint, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a sectional view of a basic structure of an adhesive joint according to the invention;

FIG. 1A is an enlarged view of the detail A of FIG. 1; and

DESCRIPTION OF THE PREFERRED EMBODIMENTS

Figure 2:
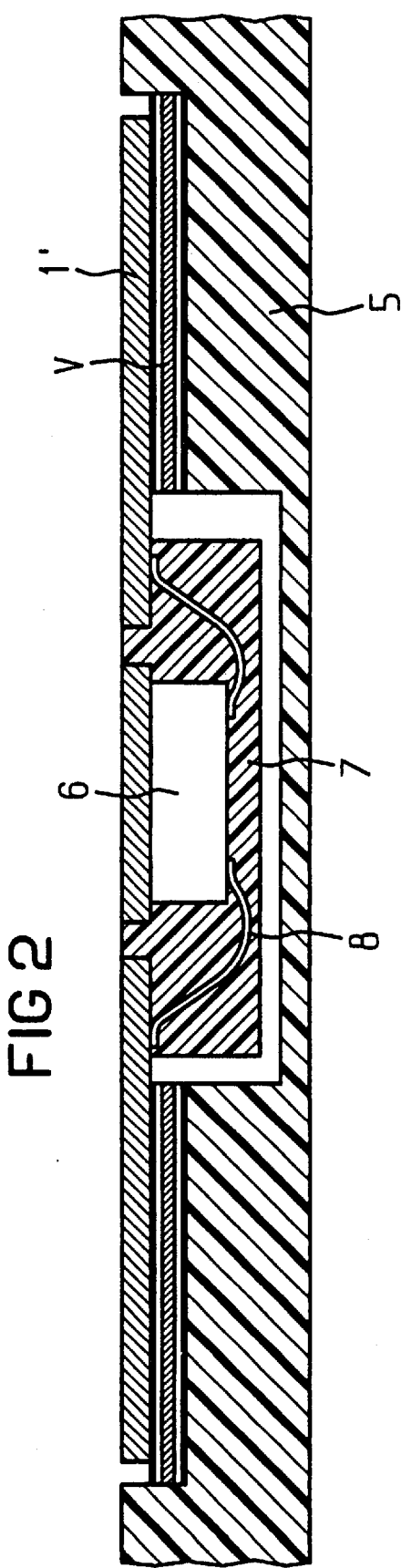
FIG. 2 is a sectional view of a card configuration with a lead frame module.

Referring now to the figures of the drawing in detail and first, particularly, to FIGS. 1 and 1A thereof, there is seen an arrangement in which an adhesive joint is shown in detail in the enlargement circle A. The adhesive joint is centered around a flexible core layer 4 composed of acrylate. The flexibility of the core layer 4 is adjusted to the specific requirement of the card body 5 and the bending stresses expected in the context of its application. The core layer 4 is provided on both sides with a transitional layer 3. Both a PET (polyethylene terephthalate) film and a polycarbonate film can be used for the transitional layer. Applied to these transitional layers 3 are outer layers 2, which in turn are composed of a hot-melt adhesive. These outer layers 2 in turn form the direct contact layer with respect to the adherend elements which are connected to each other. In the non-enlarged illustration of FIG. 1, the one adherend element is formed by a card element composed of plastic. The other adherend element is represented by a carrying element 1 which carries a semiconductor chip 6. The carrying element may, in principle, be a metal lead frame or else a module carrier made of epoxy-resin glass-fiber-reinforced fabric or else ceramic.

FIG. 2 illustrates an arrangement in which the card configuration in turn comprises a card element 5 made of plastic, the module comprising a carrying element 1' which is made up of a metal conductive lead frame. As illustrated in FIG. 2, bonds or bond wires 8 are provided between the semiconductor chip 6 and the lead frame 1'. The semiconductor chip 6 and the bonds 8 are covered overall by a covering 7. The lead frame 1' is in turn connected by means of an adhesive joint V to the card element 5, the adhesive joint V having a structure such as that which is illustrated in the enlargement A in FIG. 1A.

We claim:

1. A smart card configuration, comprising:

a card element made of plastic;

a carrying element and a semiconductor chip supported on said carrying element; and an adhesive joint assembly disposed between and adhesively joining said carrying element to said card element, said adhesive joint assembly including:

a multi-layer adhesive laminate layer;

said laminate layer being formed of a flexible core layer made of acrylate, outer layers made of hot-melt adhesive resepectively adjoining said carrying element and said card element, and a transitional layer respectively disposed between said outer layers and said core layer.

2. The smart card configuration according to claim 1, wherein said transitional layer is a PET film.

3. The smart card configuration according to claim 1, wherein said transitional layer is a polycarbonate film.

4. The card configuration according to claim 1, wherein said carrying element is electrically conductive.

5. The card configuration according to claim 1, wherein said carrying element is composed of epoxy-resin glass-fiber-reinforced fabric.

6. The card configuration according to claim 1, wherein said carrying element is composed of a ceramic material.

* * * * *

UNITED STATES PATENT AND TRADEMARK OFFICE
CERTIFICATE OF CORRECTION

PATENT NO. : 6,469,902 B1  Page 1 of 1
DATED : October 22, 2002
INVENTOR(S) : Frank Püschner et al.

It is certified that error appears in the above-identified patent and that said Letters Patent is hereby corrected as shown below:

<u>Title page,</u>
Item [30], should read as follows:
-- May 15, 1997    (DE) ………. 297 08 687.1 --

Signed and Sealed this

Twenty-fifth Day of February, 2003

JAMES E. ROGAN
*Director of the United States Patent and Trademark Office*